(12) United States Patent
Tay

(10) Patent No.: US 7,582,957 B2
(45) Date of Patent: Sep. 1, 2009

(54) INTEGRATED CIRCUIT PACKAGE SYSTEM WITH ENCAPSULATION LOCK

(75) Inventor: Lionel Chien Hui Tay, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 355 days.

(21) Appl. No.: 11/558,404

(22) Filed: Nov. 9, 2006

(65) Prior Publication Data

US 2008/0111218 A1 May 15, 2008

(51) Int. Cl.
*H01L 23/495* (2006.01)
(52) U.S. Cl. ....................... 257/676; 257/666
(58) Field of Classification Search ................. 257/666, 257/676, 787
See application file for complete search history.

(56) References Cited

U.S. PATENT DOCUMENTS

| | | | |
|---|---|---|---|
| 4,857,989 A * | 8/1989 | Mori et al. ................... | 257/666 |
| 4,942,452 A * | 7/1990 | Kitano et al. ................ | 257/666 |
| 4,942,454 A * | 7/1990 | Mori et al. ................... | 257/676 |
| 5,150,193 A * | 9/1992 | Yasuhara et al. ............. | 257/669 |
| 5,220,195 A * | 6/1993 | McShane et al. ............. | 257/666 |
| 6,380,048 B1 | 4/2002 | Boon et al. | |
| 6,501,158 B1 * | 12/2002 | Fazelpour et al. ........... | 257/670 |
| 6,630,373 B2 | 10/2003 | Punzalan et al. | |
| 7,060,535 B1 | 6/2006 | Sirinorakul et al. | |
| 7,060,536 B2 | 6/2006 | Punzalan et al. | |
| 7,067,908 B2 | 6/2006 | Jang | |
| 2005/0260795 A1* | 11/2005 | Park et al. .................... | 438/111 |
| 2006/0186517 A1* | 8/2006 | Jang ............................ | 257/676 |
| 2006/0255438 A1* | 11/2006 | Omori et al. ................. | 257/670 |
| 2007/0007634 A1* | 1/2007 | Youn et al. ................... | 257/676 |

* cited by examiner

*Primary Examiner*—S. V Clark
(74) *Attorney, Agent, or Firm*—Mikio Ishimaru

(57) ABSTRACT

An integrated circuit package system is provided including forming a paddle having holes with a hole size in a range about tens to hundreds of micrometers, mounting a device over the paddle, and filling an encapsulation in the holes.

16 Claims, 3 Drawing Sheets

INTEGRATED CIRCUIT PACKAGE SYSTEM WITH ENCAPSULATION LOCK

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Contemporary electronics expose integrated circuits and packages to more demanding and sometimes new environmental conditions, such as cold, heat, and humidity requiring integrated circuit packages to provide robust structures.

Numerous technologies have been developed to meet these requirements. Some of the research and development strategies focus on new technologies while others focus on improving the existing and mature technologies. Research and development in the existing technologies may take a myriad of different directions.

One proven way to reduce cost is to use mature package technologies with existing manufacturing methods and equipments. Existing packaging technologies struggle to cost effectively meet the ever-demanding thermal, reliability, and structural requirements of today's integrated circuits and packages.

Most integrated circuit devices use molded plastic epoxy as an epoxy mold compound (EMC) for protecting package. But the poor heat dissipation property of EMC sometimes leads to device malfunctions. Some integrated circuit devices are large and/or very thin such that they become susceptible to warpage. Both heat and warpage may lead to delamination of the molding compound. The encapsulation delamination may also pose other problems, such as poor performance in moisture sensitivity level (MSL) tests.

Thus, a need still remains for an integrated circuit package system providing low cost manufacturing and improved reliability for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a paddle having holes with a hole size in a range about tens to hundreds of micrometers, mounting a device over the paddle, and filling an encapsulation in the holes.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
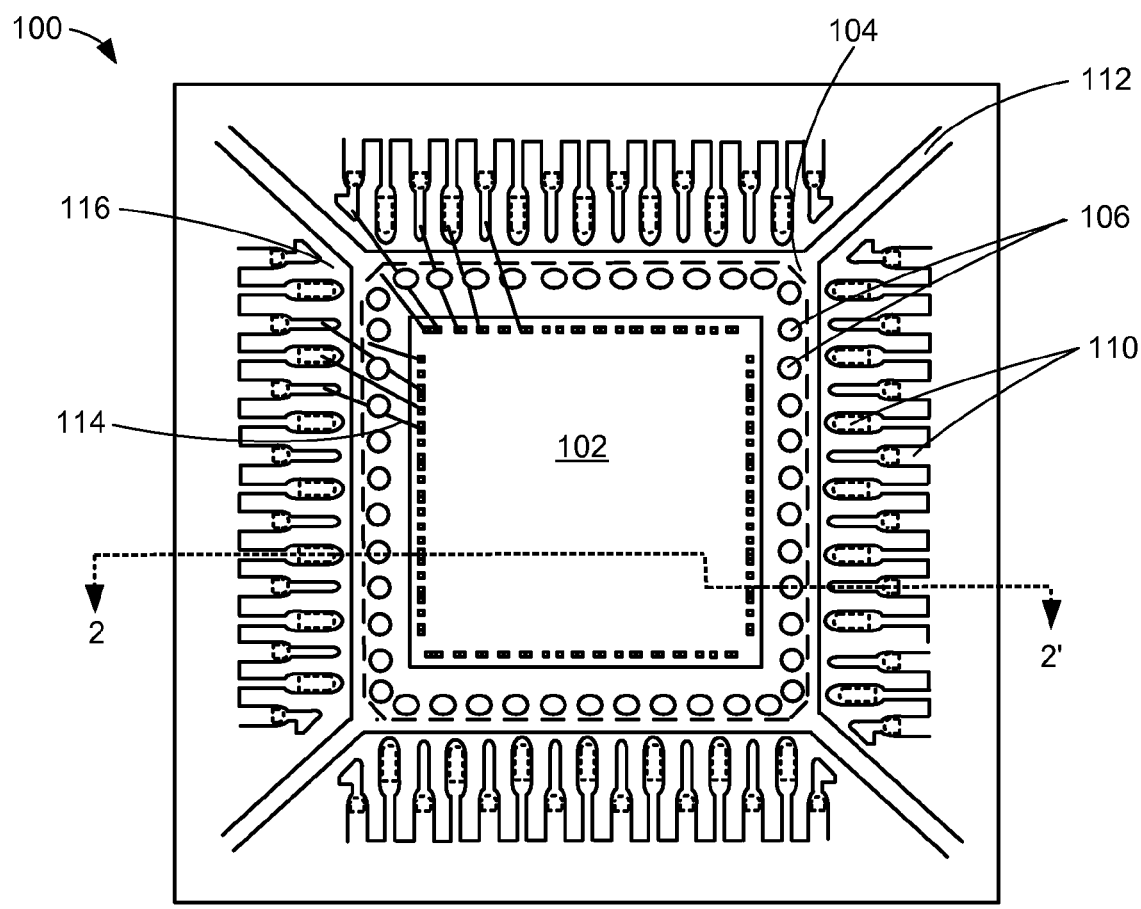
FIG. 1 is a plan view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Referring now to FIG. 1, therein is shown a plan view of an integrated circuit package system 100 in an embodiment of the present invention. The integrated circuit package system 100 includes a device 102, such as an integrated circuit die, over a paddle 104, such as die-attach paddle. The paddle 104 includes holes 106, such as through holes, depressions, or recesses, along the sides of the paddle 104. The holes 106 may be formed in a number of different geometric shapes, such as a circle or a square. For illustrative purposes, the holes 106 are shown along the sides of the paddle 104, although it is understood that the holes 106 may be located in other regions of the paddle 104.

The device 102 does not overhang the paddle 104 and do not block the holes 106. External interconnects 110, such as leads, are along a peripheral region of the integrated circuit package system 100. Tie bars 112 connect to corners of the paddle 104. Internal interconnects 114, such as bond wires, connect the device 102 and the external interconnects 110.

An encapsulation 116, such as an epoxy mold compound, covers the device 102, the paddle 104, the tie bars 112, the external interconnects 110, and the internal interconnects 114. The encapsulation 116 fills the holes 106 forming mold locks to improve adhesion between the encapsulation 116 and the paddle 104. The mold locks form structural reinforcement holding the encapsulation 116 in place. The mold locks help resist delamination of the encapsulation 116 and improves performance in moisture sensitivity level (MSL) test.

Figure 2:
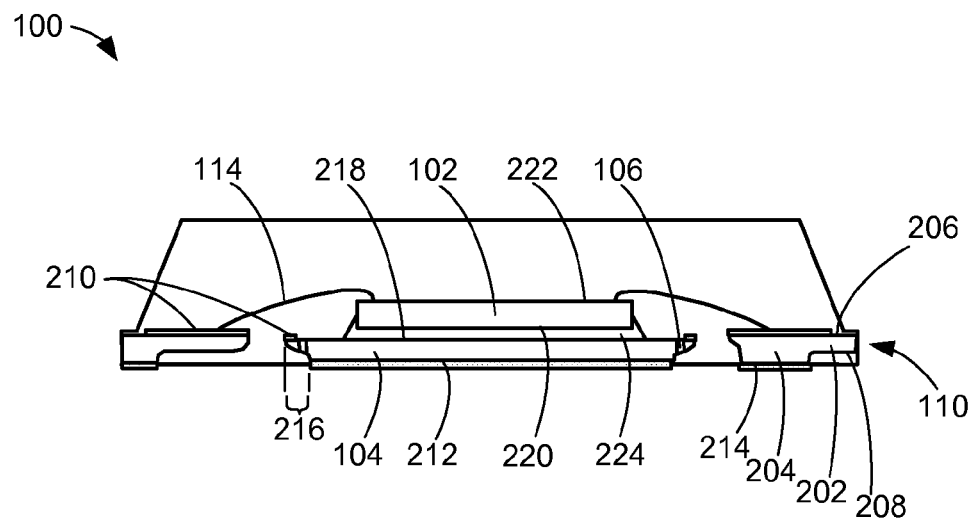
FIG. 2 is a cross-sectional view of the integrated circuit package system of FIG. 1 along a line segment 2-2' in FIG. 1.

Referring now to FIG. 2, therein is shown a cross-sectional view of the integrated circuit package system 100 of FIG. 1 along a line segment 2-2' in FIG. 1. Each of the external interconnects 110 has a lead tip 202 and a lead body 204. The lead tip 202 may be formed by a number of processes available to one ordinary skilled in the art, such as half etching the external interconnects 110. The formation for the lead tip 202 also forms the lead body 204. The lead tip 202 has a lead tip top surface 206 to a lead tip bottom surface 208. A plating 210, such as a silver plating, is on the lead tip 202 and the lead body 204 providing a better bonding surface for the internal interconnects 114.

The paddle 104 is between the external interconnects 110. A paddle bottom surface 212 of the paddle 104 is in substantially the same horizontal plane as a lead body bottom surface 214. The paddle 104 may be formed by a number of processes available to one ordinary skilled in the art, such as by half etching a peripheral region 216 of the paddle 104 from the paddle bottom surface 212. The holes 106 in a configuration of a dimple may be from a paddle top surface 218 of the paddle 104. The paddle 104 may serve other functions, such as thermal dissipation or ground connection. The plating 210 may also be applied at the peripheral region 216 of the paddle top surface 218 for ground bond sites.

For illustrative purposes, the paddle top surface 218 is described as below the same horizontal plane as the lead tip top surface 206, although it is understood that the paddle top surface 218 may not be below the lead tip top surface 206. Also for illustrative purposes, the paddle bottom surface 212 is described as in substantially the same horizontal plane as the lead body bottom surface 214, although it is understood that the paddle bottom surface 212 and the lead body bottom surface 214 may not be in substantially the same horizontal plane.

The device 102 has a non-active side 220 and an active side 222. An adhesive 224, such as a die attach adhesive, attaches the non-active side 220 and the paddle 104. The internal interconnects 114 attach on the active side 222.

Figure 3:
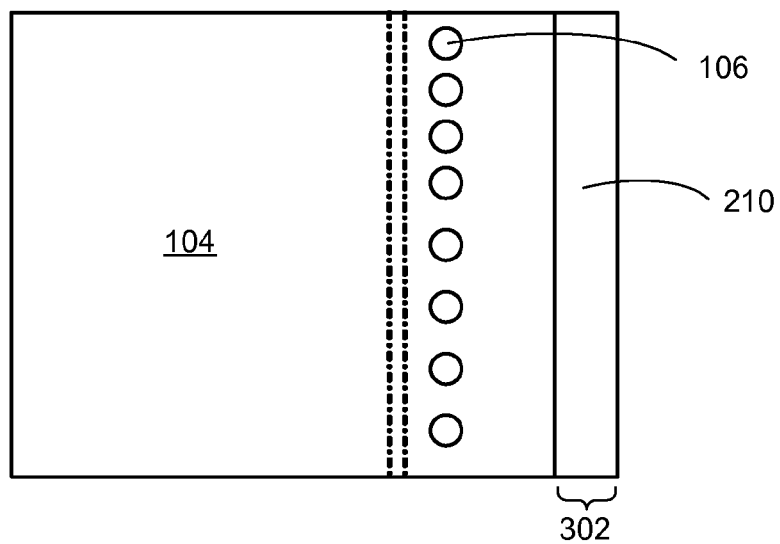
FIG. 3 is a detailed top view a side of the paddle of the integrated circuit package system of FIG. 1.

Referring now to FIG. 3, therein is shown a detailed top view a side of the paddle 104 of the integrated circuit package system 100 of FIG. 1. The holes 106 are shown along a peripheral region 302 of the paddle 104, wherein the peripheral region 302 has the plating 210. For illustrative purposes, the holes 106 described at the peripheral region 302, although it is understood that the holes 106 may be located in other regions, such as in an inner region, of the paddle 104.

Figure 4:
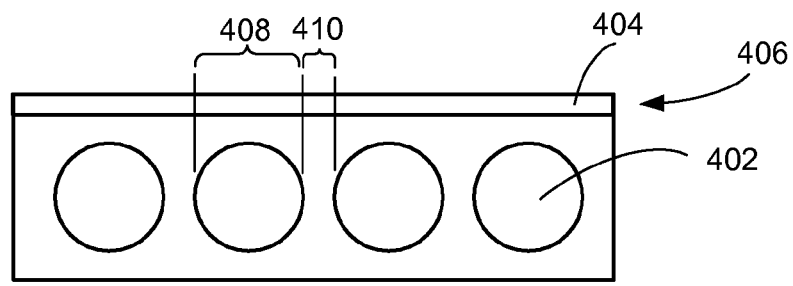
FIG. 4 is a detailed top view a side of a paddle in an alternative embodiment of the present invention.

Referring now to FIG. 4, therein is shown detailed top view a side of a paddle 400 in an alternative embodiment of the present invention. The paddle 400 may represent the paddle 104 of FIG. 1 and may be included in the integrated circuit package system 100 of FIG. 1. Holes 402 in the paddle 400 may represent the holes 106 of FIG.1. A plating 404, such as a silver plating, is at a peripheral region 406 of the paddle 400 providing bond sites, such as ground bond sites.

The holes 402 have hole sizes 408, such as diameters, and separations 410 such that a number of the holes 402 are measured in the order of tens to hundreds of micrometers. The ratio of the hole size and the separation range about 1:2 to 2:1. For illustrative purposes, the holes 402 are shown as circles, although it is understood that the holes 402 may be implement in different geometric shapes, such as a square, and the ratio may be a ratio with appropriate hole size metrics for the different geometric shape, such as a side of a square. Further for illustrative purposes, the holes 402 are shown substantially the same, although it is understood that the holes 402 may be different.

It has been unexpectedly discovered that the size and separation of the holes 402, such as through holes, depressions, or both, in the paddle 400 alleviate stress build up and stress concentration that occurs with long straight portions of other slot configurations. This stress causes delamination resulting in structural integrity problems, reliability problems, and poor performance in moisture sensitivity level (MSL) test. The number, size, and separation of the holes 402 provide the cumulative adhesion of the encapsulation 116 of FIG. 1 to the integrated circuit package system 100 and a distributed mold lock system while alleviating the stress described earlier.

Figure 5:
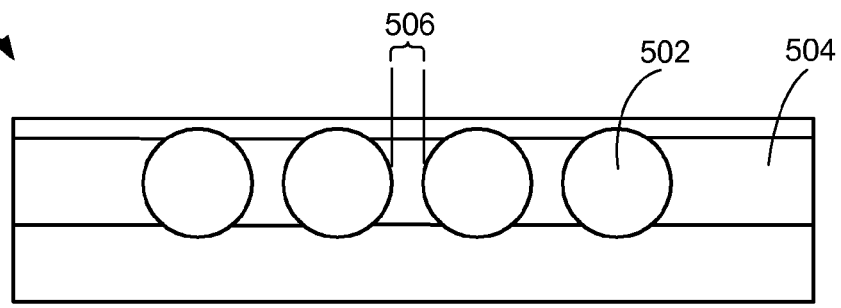
FIG. 5 is a detailed top view a side of a paddle in another alternative embodiment of the present invention.

Referring now to FIG. 5, therein is shown a detailed top view a side of a paddle 500 in another alternative embodiment of the present invention. The paddle 500 may represent the paddle 104 of FIG. 1 and may be included in the integrated circuit package system 100 of FIG. 1. Holes 502 in the paddle 500 may represent the holes 106 of FIG.1. The holes 502 have diameters and separations 506 such that a number of the holes 502 are measured in the order of micrometers.

A plating 504, such as a silver plating, is at a peripheral region of the paddle 500 providing bond sites, such as ground bond sites. The holes 502 are through the plating 504. This configuration provides the bonding sites with the plating 504 and the mold lock features of the holes 502 for smaller sizes of the integrated circuit package system 100 and the paddle 500.

The size and separation of the holes 502, such as through holes, depressions, or both, in the paddle 500 alleviate stress build up and stress concentration that occurs with long straight portions of other slot configurations. This stress causes delamination resulting in structural integrity problems, reliability problems, and poor performance in moisture sensitivity level (MSL) test. The number of the holes 502 provides the cumulative adhesion of the encapsulation 116 of FIG. 1 to the integrated circuit package system 100 and a distributed mold lock system while alleviating the stress described earlier.

Figure 6:
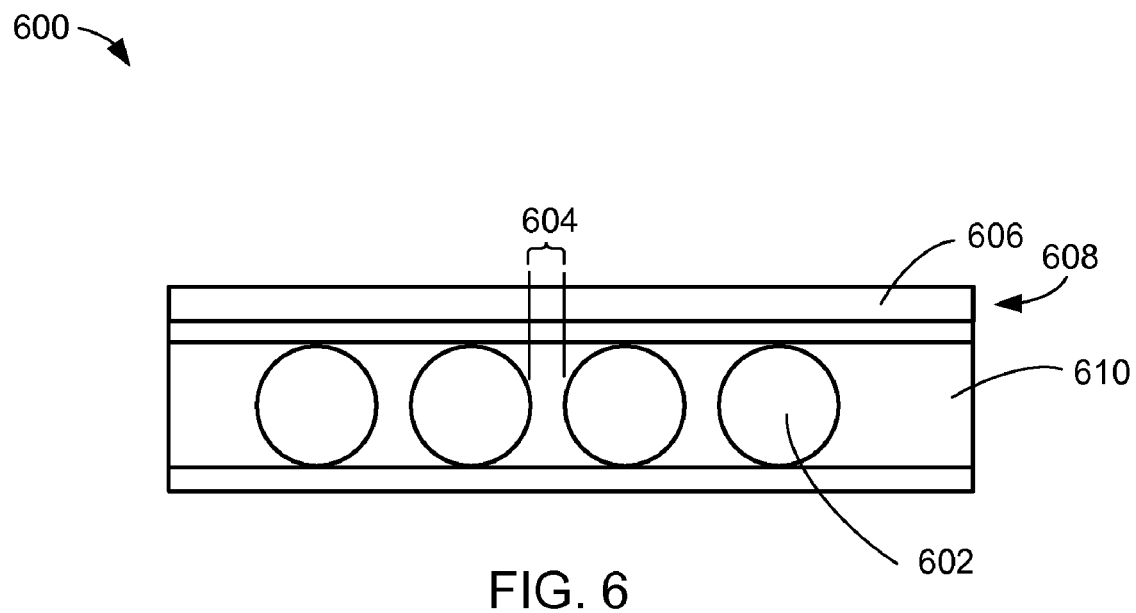
FIG. 6 is a detailed top view a side of a paddle in yet another alternative embodiment of the present invention.

Referring now to FIG. 6, therein is shown a detailed top view a side of a paddle 600 in yet another alternative embodiment of the present invention. The paddle 600 may represent the paddle 104 of FIG. 1 and may be included in the integrated circuit package system 100 of FIG. 1. Holes 602 in the paddle 600 may represent the holes 106 of FIG.1. The holes 602 have diameters and separations 604 such that a number of the holes 602 are measured in the order of micrometers.

A plating 606, such as a silver plating, is at a peripheral region 608 of the paddle 600 providing bond sites, such as ground bond sites. The holes 602 may be formed in grooves 610, wherein the grooves 610 prevent epoxy flow to the plating 606 and delamination from epoxy flow to the plating 606.

The size and separation of the holes 602, such as through holes, depressions, or both, in the paddle 600 alleviate stress build up and stress concentration that occurs with long straight portions of other slot configurations. This stress causes delamination resulting in structural integrity problems, reliability problems, and poor performance in moisture sensitivity level (MSL) test. The number of the holes 602 provides the cumulative adhesion of the encapsulation 116 of FIG. 1 to the integrated circuit package system 100 and a distributed mold lock system while alleviating the stress described earlier.

Figure 7:
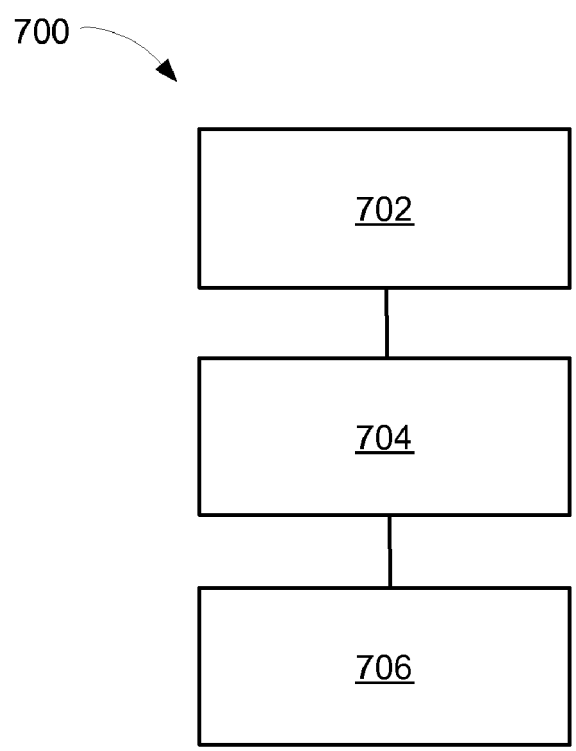
FIG. 7 is a flow chart of an integrated circuit package system for the manufacture of the integrated circuit package system in an embodiment of the present invention.

Referring now to FIG. 7, therein is shown a flow chart of an integrated circuit package system 700 for manufacture of the integrated circuit package system 100 in an embodiment of the present invention. The system 700 includes forming a paddle having holes with a hole size in a range about tens to hundreds of micrometers in a block 702; mounting a device over the paddle in a block 704; and filling an encapsulation in the holes in a block 706.

It has been discovered that the present invention thus has numerous aspects.

A principle aspect that has been unexpectedly discovered is that the present invention that the number, size, and separation of the holes, such as through holes, depressions, or both, in the paddle alleviate stress build up and stress concentration that occurs with long straight portions of other slot configurations. This stress causes delamination resulting in structural integrity problems, reliability problems, and poor performance in moisture sensitivity level (MSL) test. The number of the holes provides the cumulative adhesion of the encapsulation to the integrated circuit package system 100 and a distributed mold lock system while alleviating the stress described earlier.

Another aspect is that the present invention provides a distributed mold locks system with holes, such as through hole, depressions, or both, in the paddle while alleviating stress found in long rectangular slots.

Another aspect of the present invention provides depressions of various patterns in the paddle and not restricted to the peripheral region of the paddle. The encapsulation fills the through holes and depressions providing improved adhesion between the encapsulation and the paddle. This improved adhesion improves performance in moisture sensitivity level (MSL) test.

Yet another aspect of the present invention provides depressions of various structures such that some depressions may be through the paddle while others may not. The die-attach adhesive may also fill the depressions or a portion of the depressions reducing the delamination of the device and the paddle.

Yet another aspect of the present invention provides multiple mold lock features for a distributed and multi-dimensional locking structure support. The depressions may also be on the paddle bottom surface as well as the paddle top surface.

Yet another aspect of the present invention provides structures for the mold lock features with improved adhesion between the holes.

Yet another aspect of the present invention provides holes in the silver plating ring used for ground bond sites. This provides flexibility for this distributed holes configuration for smaller package and device sizes.

Yet another aspect of the present invention provides holes in grooves to control epoxy bleeding or adhesive bleeding to the silver-plating ring. This mitigates or eliminates another potential source of delamination.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
    forming a paddle having a groove with holes through the groove, the holes having a hole size in a range about tens to hundreds of micrometers and the paddle having a plating at a peripheral region of the paddle;
    mounting a device over the paddle; and
    filling an encapsulation in the holes.

2. The system as claimed in claim 1 wherein forming the paddle having the holes includes forming the paddle having through holes and depressions.

3. The system as claimed in claim 1 further comprising forming a plating on the paddle with the holes through the plating.

4. An integrated circuit package system comprising:
    forming a die-attach paddle having holes with a diameter in a range about tens to hundreds of micrometers and a ratio of the diameter and a separation between the holes in a range about 1:2 to 2:1;
    mounting an integrated circuit die over the die-attach paddle; and
    filling an encapsulation in the holes.

5. The system as claimed in claim 4 wherein forming the die-attach paddle having the holes includes forming the holes in a circular geometric shape.

6. The system as claimed in claim 4 wherein forming the die-attach paddle having the holes and the separation between the holes are in micrometer scale includes forming the holes at a peripheral region of the paddle.

7. The system as claimed in claim 4 wherein forming the die-attach paddle having the holes includes forming a tie bar connected to the die-attach paddle.

8. The system as claimed in claim 4 further comprising connecting an external interconnect and the integrated circuit die.

9. An integrated circuit package system comprising:
    a paddle having a groove and holes through the groove, the holes having a hole size in a range about tens to hundreds of micrometers and the paddle having a plating at a peripheral region of the paddle;

a device over the paddle; and an encapsulation in the holes.

10. The system as claimed in claim 9 wherein the paddle having the holes includes through holes and depressions.

11. The system as claimed in claim 9 further comprising a plating on the paddle with the holes through the plating.

12. The system as claimed in claim 9 wherein:

the paddle is a die-attach paddle having the holes with a diameter in a range about tens to hundreds of micrometers and a ratio of the diameter and a separation between the holes in a range about 1:2 to 2:1;

the device is an integrated circuit die over the paddle; and the encapsulation in the holes is a cover for the device.

13. The system as claimed in claim 12 wherein the die-attach paddle having the holes has the holes in a circular geometric shape.

14. The system as claimed in claim 12 wherein the die-attach paddle having the holes has the holes at a peripheral region of the paddle.

15. The system as claimed in claim 12 wherein the die-attach paddle is connected to a tie bar.

16. The system as claimed in claim 12 further comprising an internal interconnect between an external interconnect and the integrated circuit die.

* * * * *